(12) United States Patent
Morii

(10) Patent No.: US 6,599,780 B2
(45) Date of Patent: Jul. 29, 2003

(54) FILM PRODUCTION METHOD AND FILM PRODUCED THEREBY

(75) Inventor: Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 5 days.

(21) Appl. No.: 09/791,548

(22) Filed: Feb. 26, 2001

(65) Prior Publication Data
US 2001/0024842 A1 Sep. 27, 2001

(30) Foreign Application Priority Data

Feb. 24, 2000 (JP) ........................................ 2000-047764

(51) Int. Cl.[7] .......................... H01L 21/82; C08F 2/48; B05B 3/06
(52) U.S. Cl. .................. 438/131; 427/508; 427/557; 427/558; 427/595
(58) Field of Search .................. 438/131, 600, 438/128, 598; 427/557, 558, 508, 595

(56) References Cited

U.S. PATENT DOCUMENTS

| 4,396,704 A | * | 8/1983 | Taylor .................. 430/311 |
| 4,474,831 A | * | 10/1984 | Downey .................. 427/398.1 |
| 4,500,628 A | * | 2/1985 | Taylor .................. 430/311 |
| 4,517,276 A | * | 5/1985 | Lewis .................. 430/192 |
| 4,711,822 A | * | 12/1987 | Choyke et al. .................. 428/458 |
| 4,869,760 A | * | 9/1989 | Matsunami .................. 156/151 |
| 4,966,442 A | * | 10/1990 | Ono et al. .................. 350/339 |
| 5,053,318 A | * | 10/1991 | Gulla et al. .................. 430/315 |
| 5,213,917 A | * | 5/1993 | Gulla et al. .................. 430/14 |
| 5,246,821 A | * | 9/1993 | Abe et al. .................. 430/393 |
| 5,384,382 A | * | 1/1995 | Mori et al. .................. 528/15 |
| 5,534,609 A | * | 7/1996 | Lewis et al. .................. 528/15 |
| 5,932,309 A | * | 8/1999 | Smith et al. .................. 428/373 |
| 5,955,192 A | * | 9/1999 | Fukushima et al. .................. 428/345 |
| 6,140,449 A | * | 10/2000 | Mori et al. .................. 528/21 |
| 6,180,188 B1 | * | 1/2001 | Belleville et al. .................. 427/162 |
| 6,194,507 B1 | * | 2/2001 | Ali .................. 524/430 |
| 6,344,272 B1 | * | 2/2002 | Oldenburg et al. .................. 252/587 |

FOREIGN PATENT DOCUMENTS

| JP | 339876 | * | 12/1998 |
| JP | 10-325956 | * | 12/1998 |
| JP | 10325957 | * | 12/1998 |

* cited by examiner

Primary Examiner—Jerome Jackson
Assistant Examiner—Shrinivas H. Rao
(74) Attorney, Agent, or Firm—Oliff & Berridge, PLC

(57) ABSTRACT

A method of producing an electrically conductive film is provided having excellent conductivity at low cost. The method includes steps of forming a colloid layer on a substrate, and then irradiating the surface of the colloid layer with an energy beam such that higher energy beam absorption occurs in the colloid layer than in the substrate. Preferably, the colloid layer is a metal colloid layer and an electrically conductive film is obtained as the film.

8 Claims, 2 Drawing Sheets

FILM PRODUCTION METHOD AND FILM PRODUCED THEREBY

BACKGROUND OF THE INVENTION

1. Field of Invention

The present invention relates to a method of producing a film from a liquid phase, and to a film obtained by such a method. More specifically, the present invention relates to a method of producing a film such as an electrically conductive metal film for use as an interconnection or a terminal, and to a film such as an electrically conductive metal colloid film having excellent conductivity obtained by that method.

2. Description of Related Art

Conventionally, various functional films (thin films such as an electrically conductive film and an insulating film) used in electronic devices such as a semiconductor device are formed by a process in a vacuum such as vacuum evaporation, chemical vapor deposition, and sputtering.

SUMMARY OF THE INVENTION

Because the above-described process is performed in a vacuum, a large-sized and complicated apparatus is generally needed. Thus, there is a need for a process for more easily producing a high-performance thin-film.

An object of the present invention is to at least provide a method of producing a film (thin film) having a good characteristic in a simple manner using a simple apparatus.

The present invention provides a method of producing a film, which may include the steps of forming a colloid layer on a substrate, and irradiating the surface of the colloid layer with an energy beam such that higher energy beam absorption occurs in the colloid layer than in the substrate.

The present invention is based at least on an idea of the present inventor that if a metal colloid is subjected to a particular process, an organic component contained in the metal colloid is removed, and metal-to-metal contacts are formed, thereby achieving the above object.

DETAILED DESCRIPTION OF PREFERRED EMBODIMENTS (Method of Producing a Film)

A method of producing a film according to the present invention is described in detail below.

In the method of producing a film according to the present invention, a colloid layer is formed on a substrate, and then the surface of the colloid layer is irradiated with an energy beam such that higher energy beam absorption occurs in the colloid layer than in the substrate. This method makes it possible to easily form a film having a good characteristic in a simple manner without having to use a large-sized or complicated apparatus.

More specifically, in the present invention, a metal colloid layer is first formed on a substrate, and then the metal colloid layer is subjected to the above-described process so as to obtain an electrically conductive film having excellent conductivity at low cost.

The method of producing a film according to the present invention is described in further detail below with reference to exemplary embodiments in which an electrically conductive film is formed from a metal colloid.

Figure 1:
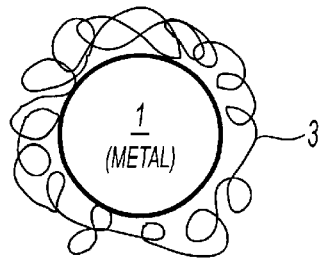
FIG. 1 is a schematic diagram illustrating a metal colloid including an organic material.

In general, a metal colloid contains an organic component for stabilizing the colloid. As shown in FIG. 1, a metal (particle) 1 is surrounded by such an organic component 3. Organic materials usable as the organic component 3 include citric acid, PVP (N-vinyl-2-pyrrolidone), MMs-NVP (melcaptomethylstyleneN-vinyl-2-pyrrolidone) copolymer, and polyacrylonitrile.

Figures 2A, 2B:
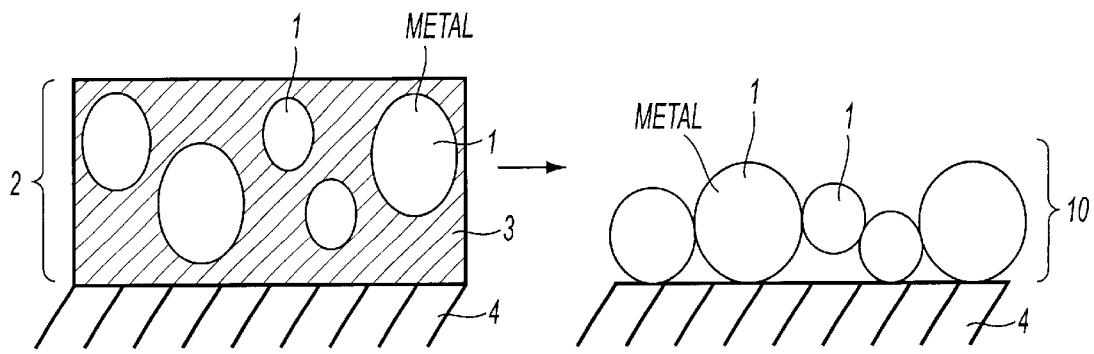
FIGS. 2(a)–(b) are schematic diagrams illustrating a metal colloid layer which has not been irradiated with an energy beam (FIG. 2(a)), and an electrically conductive film obtained after being irradiated with an energy beam (FIG. 2(b)) according to an exemplary embodiment of the present invention.

In one exemplary embodiment, as shown in FIG. 2(a), a metal colloid layer 2 formed on a substrate 4 from a liquid phase contains metal (colloid) 1 dispersed in an organic material (layer) 3 (before it is subjected to irradiation with an energy beam described later). If the metal colloid layer 2 is subjected to the irradiation with an energy beam according to the present invention, only the organic material 3 is removed from the metal colloid layer 2, and thus strong contacts are formed among metal (particles) 1 (FIG. 2(b)). As a result, an excellent electrically conductive film 10 having a high conductivity is obtained. Furthermore, in the present embodiment, because the organic material can be removed in a very short time by the irradiation with the energy beam and the wavelength of the energy beam can be selected within a certain range, it is possible to form a desired electrically conductive film without imposing an influence upon the substrate.

In another exemplary embodiment, although there is no particular limitation in the energy beam which is absorbed in the metal colloid layer by a greater amount than in the substrate, specific examples include a near ultraviolet ray, a visible ray, a near infrared ray, an infrared ray, and a far infrared ray. The energy beam may be applied to the surface of the metal colloid layer using an apparatus which emits such an emery beam, and more preferably, using a high-power lamp which emits light in a visible and near infrared range.

The energy beam should be absorbed in the metal colloid layer by a greater amount than in the substrate. Preferably, the ratio of the absorbence in the metal colloid layer to that in the substrate is 2 to infinity, and more preferably 100 to infinity. If the absorbence ratio is within the above range, the irradiation energy is mainly absorbed by the metal colloid layer, and thus the substrate is prevented from being damaged by heat.

Figure 3:
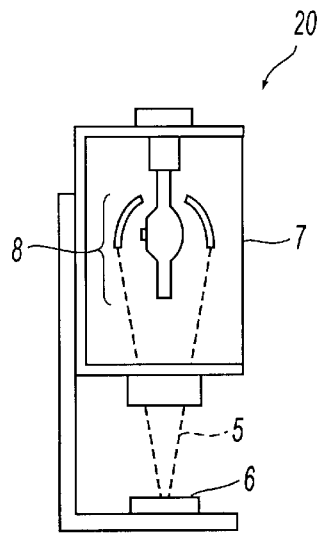
FIG. 3 is a cross-sectional view illustrating a xenon lamp which is an example of an energy beam irradiating apparatus used to practice a production method according to the present invention.

Examples of apparatuses for radiating the energy beam include a xenon lamp, a halogen lamp, a mercury-vapor lamp, and any of the above lamps provided with a filter. Of these lamps, the xenon lamp is desirable (an example is shown in FIG. 3). It is possible to obtain a high-quality film pattern by selectively illuminating a particular area of a film with an energy beam using an Ar laser, a YAG:Nd laser, or an excimer laser thereby selectively changing the characteristic of the film.

Although there is no particular limitation in the amount of energy beam irradiation to the surface of the metal colloid layer as long as the effects of the present invention can be obtained, it is preferable that the energy beam is irradiated using an energy beam irradiating apparatus of 100 W to 1 kW and more preferably 400 W to 600 W for a period of 10 to 600 sec, and more preferably 50 to 200 sec.

Although the energy beam may be such a beam which is applied simultaneously to the entire surface, it is preferable to use a focused energy beam.

The metal colloid layer may be formed by applying metal which can form the metal colloid layer and an organic material on the substrate by means of a spin coating technique, a film forming technique using an ink-jet recording head, a dipping technique, or a blade coating technique. This method is advantageous in that a solution of an organic material containing metal particles which can form a metal colloid layer can be supplied onto a substrate without needing a process in a vacuum. Of the above-described techniques, in particular, the spin coating technique and the film forming technique using the ink-jet recording head are preferable.

A specific method of forming the metal colloid layer using the spin coating technique is to first perform oxygen plasma treatment so that surface of the substrate becomes lyophilic to ink (solution), and then apply a solution containing a metal colloid to the surface of the substrate.

A specific example of forming the metal colloid layer using the film forming technique using the ink-jet recording head is to first subject the substrate to a patterning process as pretreatment so that the substrate becomes lyophilic or lyophobic to the ink and then emit the ink in the form of a solution of the metal colloid using the ink-jet recording head.

According to another exemplary embodiment, the electrically conductive film is formed in a very short time by irradiation with the energy beam, and thus it is possible to use even metal that would otherwise be easily oxidized. Thus, the technique of the present embodiment can be applied to a wide variety of metals. Thus, there is no particular limitation in the type of metal. For example, silver, gold, palladium, and platinum may be used. Of these metals, silver, gold, and palladium are more preferable from a stability point of view.

Although there is no particular limitation in the thickness of the metal colloid layer, it is preferable to select the thickness in the range from 0.1 to 5 $\mu$m, and more preferably from 0.5 to 2 $\mu$m.

In the exemplary embodiments of the present invention, materials usable for the substrate on which the metal colloid layer is formed include glass and a macromolecular material such as polyaniline and polyester.

When a metal colloid layer is formed using a solution containing metal which can form a metal colloid according to the production method of the present embodiment, a metal colloid layer is formed from a liquid phase and the organic component is removed from the colloid layer in a very short time during irradiation with the energy beam, and thus it is possible to produce the electrically conductive metal film having excellent conductivity at low cost.

Note that the film production method according to the present invention is not limited to those described above with reference to the exemplary embodiment. For example, instead of the metal colloid layer, a semiconductor colloid layer containing cadmium selenide, cadmium selenide, or titanium oxide or the like may be employed as the colloid layer to produce a film (thin film) such as a semiconductor film having a good characteristic.

(Electrically Conductive Metal Film)

The film according to the present invention is described in further detail below with reference to exemplary embodiments in which an electrically conductive film is formed by the above-described film production method.

In one exemplary embodiment, the electrically conductive film is preferably formed of a metal colloid with a particle size of 5 to 1000 nm and more preferable 200 to 500 nm.

In another exemplary embodiment, although there is no particular limitation in the thickness of the electrically conductive film, it is preferable to select the thickness within the range from 0.1 to 5 $\mu$m and more preferably from 0.5 to 2 $\mu$m.

The electrically conductive film according to the exemplary embodiments may be used, for example, to form an interconnection, a terminal, and a solid metal hydride. In particular, the electrically conductive film according to the present embodiment is useful when it is used to form an interconnection or a terminal because the electrically conductive film has excellent conductivity as described above.

Note that the film according to the present invention is not limited to those described above with reference to the exemplary embodiments, but the invention may also be applied to other types of functional thin films. For example, functional thin films used in semiconductor devices or other functional devices may be formed according to the present invention.

The production method according to the present invention is described in further detail below with reference to specific examples. Note that the following description is by way of example only and not limitation.

(Embodiment 1)

Citric acid was employed as the organic material, and an aqueous solution of citric acid was mixed with an aqueous solution of silver nitrate. The resultant mixed solution was subjected to reflux so as to obtain a high-density of aqueous solution of Ag colloid. A drop of the resultant solution was placed on a glass substrate, and the glass substrate was spun (and dried at room temperature). As a result, a sliver colloid layer was formed on the glass substrate. The surface of the silver colloid layer was photographed via a microscope. Copper-like luster was observed. The Ag colloid should exhibit silver luster. A possible reason is that the silver colloid layer exhibits light absorption in the visible range, which arises from levels produced by bonding between silver atoms and the organic material.

Using a xenon lamp 20 (USHIO Optical Module X (of the downward illuminating type with an ellipse mirror) available from Ushio, Inc.) such as that shown in FIG. 3, a sample 6 consisting of the glass substrate and the silver layer formed thereon is irradiated with an energy beam 5 having higher absorbence in the silver colloid layer than in the glass substrate for 60 sec, such that light emitted from a light source 8 disposed in a lamp box 7 was focused on the sample 6, thereby forming an electrically conductive film. The surface of the silver colloid layer was observed via a microscope (during the irradiation). A partial color change was observed when about 10 sec elapsed since the start of the irradiation, and the color changed over the entire surface when 60 sec elapsed. This is an (indirect) evidence indicating that the organic material was removed from the silver colloid layer (and thus the electrically conductive silver film was formed). The measured particle size of the silver colloid forming the electrically conductive silver film was about 300 nm.

(Evaluation of Metallic Property: Measurement of Reflectance Spectrum)

Figure 4:
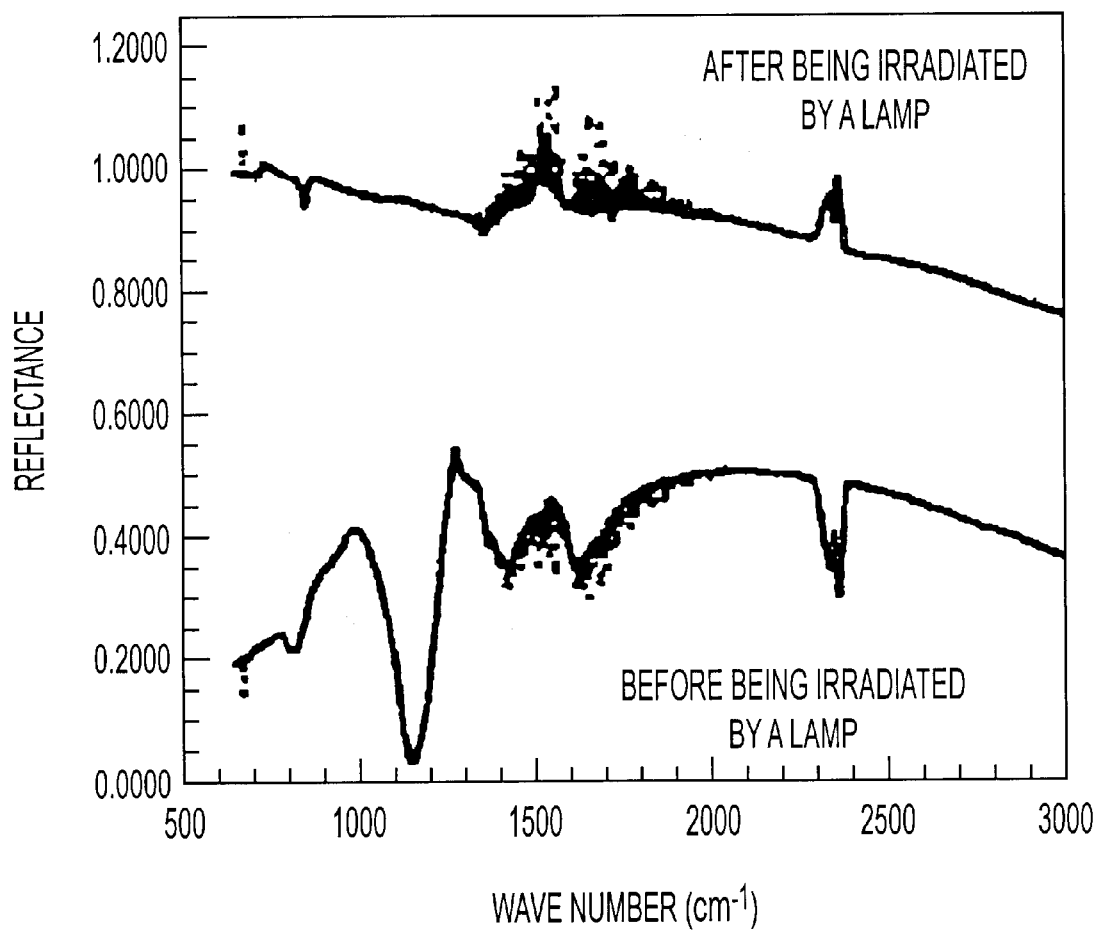
FIG. 4 is a graph (reflectance vs. wave number graph) illustrating the reflectance spectrum of an electrically conductive metal film (irradiated with an energy beam) according to an exemplary embodiment of the present invention, and also illustrating the reflectance spectrum of a metal colloid layer in a state to be converted into the electrically conductive film (by means of irradiation of the energy beam).

The reflectance of the obtained electrically conductive silver film (after being irradiated by the lamp) was measured. The obtained reflectance spectrum (reflectance vs. wave number) is shown in FIG. 4, wherein the reflectance spectrum of the silver colloid layer obtained before being irradiated by the lamp is also shown. In FIG. 4, the reflectance is represented in relative units with respect to the reflectance of Al (that is, the reflectance of Al is taken as unity).

In general, it is possible to determined whether a sample (such as an electrically conductive film or a metal colloid film) is metallic or not by evaluating the reflectance spectrum of the sample. That is, in the case where the sample is metallic, the reflectance approaches unity as the energy decreases to 0 (as the wave number decreases to 0 $cm^{-1}$ in FIG. 4). In contrast, in the case of an insulating material (and a semiconductor), the reflectance approaches 0 as the energy decreases to 0. From the above facts, the film which has been irradiated by the lamp can be regarded as metallic.

(Evaluation of Conductivity: Preliminary Evaluation of Resistance)

The conductivity (conductance) of the obtained electrically conductive silver film was evaluated in a preliminary manner by measuring the resistance thereof for a test sample with a length of 2 mm and a thickness of 2 $\mu$m. The measured resistance was 3 $\Omega$, and thus, it turned out that the film was excellent in conductivity. Before this electrically conductive layer was formed, that is, before the silver colloid layer was irradiated with the energy beam, the measured resistance of the silver colloid layer was 10 $\Omega$. If it is taken into consideration the fact that a great change in resistance was observed between those before and after the irradiation although the evaluation was performed for the test sample in the preliminary form in which there was large contact resistance, it can be concluded that the irradiation according to the present invention is very effective to enhance the conductivity.

(Embodiments 2 and 3)

An electrically conductive gold film and an electrically conductive palladium film were formed in a similar manner as in Embodiment 1 but Ag employed in Embodiment 1 was replaced with Au (Embodiment 2) or Pd (Embodiment 3). The obtained electrically conductive films were evaluated in a similar manner as in Embodiment 1. Both electrically conductive films were as good as that obtained in Embodiment 1.

(Embodiment 4)

A electrically conductive silver film was formed in a similar manner as in Embodiment 1 except that the film forming method using the ink-jet recording head was employed instead of the spin coating method. The obtained electrically conductive film was evaluated in a similar manner as in Embodiment 1. The evaluation revealed that the obtained electrically conductive film was excellent as that obtained in Embodiment 1.

The production method according to present invention makes it possible to form a film (thin film) having a good characteristic. In particular, because a film can be formed from a liquid phase and an organic component can be removed in a very short time during irradiation of an energy beam, it is possible to easily form an electrically conductive film having excellent conductivity at low cost.

What is claimed is:

1. A method of producing a film, comprising the steps of:

forming a colloid layer on a substrate having a surface; and irradiating the surface of said colloid layer with an energy beam such that higher energy beam absorption occurs in said colloid layer than in said substrate.

2. The method of producing a film, according to claim 1, said colloid layer being a metal colloid layer, and an electrically conductive film being obtained as said film.

3. The method of producing a film, according to claim 2, a metal forming said metal colloid layer being silver, gold, or palladium.

4. The method of producing a film, according to claim 1, said energy beam irradiation being performed by a high-power lamp which emits light in a visible or near-infrared range.

5. The method of producing a film, according to claim 4, said lamp being a xenon lamp.

6. The method of producing a film, according to claim 1, said colloid layer being formed by one of a spin coating technique and a film forming technique using an ink-jet recording head.

7. A film produced by the method according to claim 1.

8. A method of producing a semiconductor device, comprising the steps of:

forming a colloid layer on a substrate having a surface; and irradiating the surface of said colloid layer with an energy beam such that higher energy beam absorption occurs in said colloid layer than in said substrate.

* * * * *